(12) United States Patent
Kim

(10) Patent No.: US 6,773,976 B2
(45) Date of Patent: Aug. 10, 2004

(54) SEMICONDUCTOR DEVICE AND METHOD FOR MANUFACTURING THE SAME

(75) Inventor: Ha Zoong Kim, Kyonggi-do (KR)

(73) Assignee: Hyundai Eletronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/820,217

(22) Filed: Mar. 29, 2001

(65) Prior Publication Data

US 2001/0040265 A1 Nov. 15, 2001

(30) Foreign Application Priority Data

May 1, 2000 (KR) .................................. 10-2000-23273

(51) Int. Cl.$^7$ ......................................... H01L 21/8238
(52) U.S. Cl. ..................... 438/224; 438/223; 438/227; 438/228; 438/462; 438/527; 438/546
(58) Field of Search ................................ 438/113, 224, 438/228, 458, 460, 462, 466, 527, 546, 223, 227

(56) References Cited

U.S. PATENT DOCUMENTS

| 5,614,445 A | * | 3/1997 | Hirabayashi | ................. 438/430 |
| 5,698,454 A | * | 12/1997 | Zommer | ...................... 438/138 |
| 5,998,282 A |   | 12/1999 | Lukaszek | |
| 6,156,596 A | * | 12/2000 | Jwo | ........................... 438/220 |
| 6,159,826 A | * | 12/2000 | Kim et al. | ................... 438/460 |

FOREIGN PATENT DOCUMENTS

JP         06005583 A   *   1/1994   ......... H01L/21/306

* cited by examiner

*Primary Examiner*—Maria Guerrero
(74) *Attorney, Agent, or Firm*—Birch, Stewart, Kolasch & Birch, LLP

(57) ABSTRACT

A semiconductor device and method of manufacturing the semiconductor device including a semiconductor substrate of a first conductivity type. A scribe lane area formed in the substrate to define chip formation areas. A deep well area formed in each chip formation area. The deep well area has a second conductivity type which is opposite the first conductivity type. Also, at least one well area is formed within the deep well area.

9 Claims, 2 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device, and a method for manufacturing the semiconductor device to reduce plasma charging damage generated during manufacturing of the semiconductor.

2. Background of the Related Art

A related art semiconductor device will be described with reference to FIG. 1. As shown in FIG. 1, when forming a twin well semiconductor device, a n-type well 4 is selectively formed at a required place on a p-type semiconductor substrate 2.

To form a triple well structure, in addition to the n-type well 4, a n-type deep well 5 is selectively formed, and a p-type well 3 is formed within the n-type deep well 5.

Consequently, in either the twin and triple well structures, a current path is formed by charged plasma 1 creating a current during the manufacturing process as follows (1) current path 6 formed by p-type well 3↔p-type substrate 2↔p-type well 3; or current path 7 formed by p-type well 3↔p-type substrate 2↔n-type well 4.

If any device including a gate oxide film, for example, a MOSFET device, is located in the current path, the gate oxide film sustains damage from the plasma 1 charge.

In general, when manufacturing a semiconductor device using plasma equipment, for example, an etching process for gate patterning, metal etching, interlayer dielectric (ILD) process, inter metal dielectric (IMD) process, and photoresist ashing, a voltage is applied to the gate oxide film during the manufacturing process.

Due to the inequality of the electric charge of the plasma 1, electric charges of differing amounts accumulate on the gate according to a position of a transistor on an wafer. The electric charges accumulated on the gates induce a voltage to the gate oxide film in a MOS capacitor.

Such a voltage causes a Fowler Nordheim (FN) tunnelling current flow through the gate oxide film, thereby, irreversibly damaging the gate oxide film.

The damage to a gate oxide film destroys or lowers the insulator characteristics of the gate oxide film. As a result, the transistor or MOSFET does not operate normally.

For example, if a negative charge density is high in a certain portion of the device while a positive charge density is high in another portion of the device, current paths (6) and (7) of FIG. 1 are formed, and a current flows.

In general, since each transistor is located close to other transistors on a chip, the difference between charge density accumulated on the gates is relatively small as compared to the difference between the gate charge density of transistors located in different chips.

Therefore, most plasma charge damage is not generated through the current path formed between the same chips or adjacent chips, but through the current path formed between the chips relatively distant from each other.

Even in the case of using a n-type semiconductor substrate, rather than a p-type semiconductor substrate, the same plasma charge damage occurs.

The related art semiconductor device and method for manufacturing the semiconductor device have the following problems.

Current paths are formed between wells located in a chip formation area. As a result, a degradation of gate oxide film may be generated by the plasma charge during the process of manufacturing the device. Such degradation of the gate oxide film destroys or lowers the characteristic of the gate oxide film as an insulator, preventing the transistor from operating normally, and reducing the reliability of the device.

SUMMARY OF THE INVENTION

Accordingly, the present invention is directed to a semiconductor device and method for manufacturing the same that substantially reduces one or more of the problems related to the limitations and disadvantages of the related art.

An object of the present invention is to provide a semiconductor device and method for manufacturing the same, in which plasma charge damage generated during the process for manufacturing the device is reduced.

To achieve these and other advantages, and in accordance with the purpose of the present invention as embodied and broadly described, a semiconductor device according to the present invention includes a first conductive semiconductor substrate formed of a first conductive material, a scribe lane area delineating a division area in a process for separating the chips formed on the semiconductor substrate, a second conductive deep well area formed on the entire chip formation area except for the scribe lane area, and second or first conductive well area formed within the deep well area.

In another aspect, a method for manufacturing the semiconductor device in accordance with the present invention includes preparing a first conductive semiconductor substrate, defining the semiconductor substrate with chip formation areas and a scribe lane area which delineates a division area when separately forming isolated chip formation areas, forming a mask on the semiconductor substrate such that the deep well areas are formed over the entire chip formation areas and not the scribe lane area, forming a deep well area on the chip formation areas, and removing the mask to selectively form a second conductive well area and a first conductive well area within the deep well area.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The above objects, and other features and advantages of the present invention will become more apparent after reading of the following detailed description when taken in conjunction with the drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
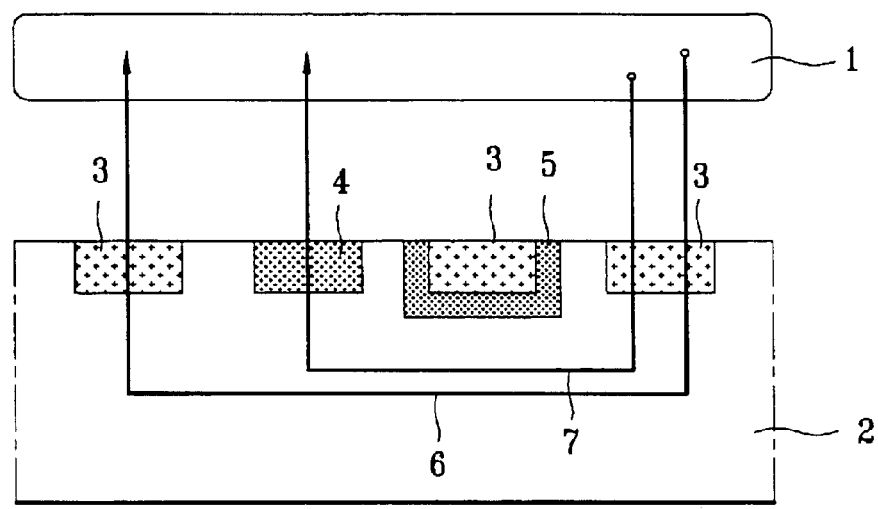
FIG. 1 is a cross-sectional view depicting the structure of the related art semiconductor device and a current paths resulting from plasma charges.
Figure 2:
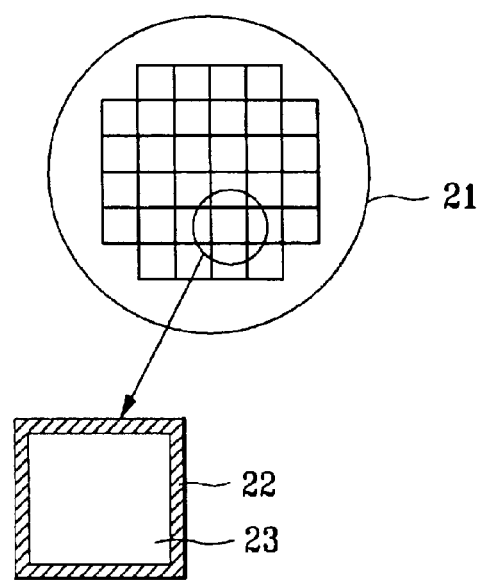
FIG. 2 is a top view depicting the wafer plane construction for applying the chip isolation method according to the present invention.

In the present invention, as shown in FIG. 2, a wafer of semiconductor substrate 21 is generally divided into chip formation areas 23 in which a device (e.g., transistor or integrated circuit chip) is formed. Also, a scribe lane area 22 indicates the area to be cut during the process of individualizing or separating the chip formation areas 23.

Figure 3:
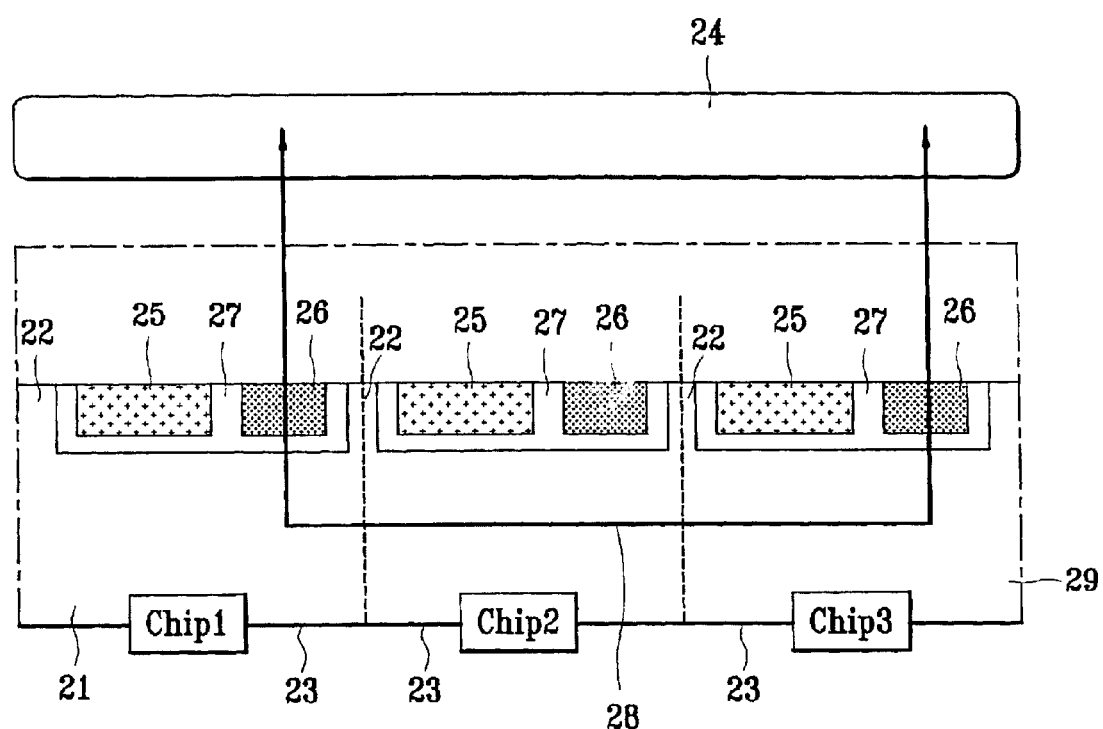
FIG. 3 is a cross-sectional view depicting the structure of the semiconductor device and the current paths resulting from plasma charges, according to the present invention.

As shown in FIG. 3, a deep well area 27 is formed in each of the chip formation areas 23 of the divided wafer 21. A scribe lane area 22 is formed between the chip formation areas chip1, chip2 and chip3 defined on a first conductor, for example, a p-type semiconductor substrate 29, and a second conductor, for example, a n-type deep well or conductive deep well 27 is formed in each of the chip formation areas 23.

Also, a p-type well 25 and a n-type well 26 are formed within the n-type deep well 27 area.

Each conductive deep well area 27, which is charged opposite to the substrate, is formed over the entire chip formation areas 23 except for the scribe lane area 22. As a result, plasma charge damage is controlled according to the field instability of the plasma applied to the semiconductor substrate 21 using plasma equipment.

That is, when the plasma 24 is near the wafer 21, the scribe lane area 22 is the same conductive material as the substrate 29 and is formed surrounding each of the chip formation areas 23. This causes each of the deep well areas 27 to be isolated from one another. The p-type well area 25 and the n-type well area 26 are formed separate from each other and within the n-type deep well 27. As a result, a pn junction is formed between the chip formation areas 23 in all directions that current would attempt to travel. For example, current will not travel along a forbidden current path 28, because of the pn junction created by the p-type substrate 29 and the n-type deep well 27 and n-type well 26.

In the method for manufacturing a semiconductor device according to the present invention, a first conductor, for example, a p-type semiconductor substrate 29 is prepared and defined with the chip formation areas 23 and the scribe lane area 22, which is used as a division area during the process of individualizing or separating the chip formation areas 23.

A mask (not shown) is formed to open all chip formation areas 23 except the scribe lane area 22.

A second conductor, for example, n-type foreign matter is formed in/on the chip formation areas 23 to form the n-type deep well 27 using the mask.

Then, the mask is removed using plasma processing or plasma equipment, and a p-type well 25 and a n-type well 26 are formed within the deep well area 27.

In a semiconductor device according to the present invention, chip formation areas 23 are electrically isolated by an npn junction formed by the n-type deep well 27 and the p-type semiconductor substrate 29 and another n-type well 27. That is, a current path is not formed in any direction between chip formation areas 23.

As shown in FIG. 3, current will not travel along the forbidden current path 28 n-type well 26↔n-type deep well 27↔p-type semiconductor substrate 29↔n-type deep well 27↔n-type well 26. The forbidden current path 28 has an npn junction structure including direction pn junctions in any direction along the forbidden current path 28. As a result, current can not flow along the forbidden current path 28. That is, the current path is not formed between chips.

Consequently, plasma current can not flow between adjacent chips through a substrate of a wafer even though an inequality of plasma charge at the wafer level exists.

Therefore, it is impossible for degradation of gate oxide film to occur as a result of the plasma charging damage effect.

Naturally, since the inequality of plasma charge at chip level may exist, a damage thereby may exist.

However, in general, transistors are closely located with respect to each other in one chip, so that the difference between charge density accumulated on the gates is relatively much less than the difference between the gate charge density of the transistors located in different chips. Therefore, the damage by inequality of plasma charge at the chip level is not great.

As has been explained, the semiconductor device and method for manufacturing the same have the following advantages.

Since a current path will not be formed by inequality of plasma charge between wells existing on different chip formation areas, the degradation of the gate oxide film is prevented. Therefore, the insulating characteristic of the gate oxide film is maintained, and consequently, the reliability of the semiconductor device is improved.

Productivity is increased by preventing the yield from being reduced by destruction of the gate oxide film. Also, the integration of a chip is increased since a protection diode is not used.

It will be apparent to those skilled in the art that various modifications and variations can be made in the semiconductor device and the method for manufacturing the same according to the present invention without departing from the spirit or scope of the invention. Thus, it is intended that the present invention covers the modifications and variations of the invention provided they come within the scope of the appended claims and their equivalents.

What is claimed is:

1. A method for manufacturing a semiconductor device comprising:
    preparing a semiconductor substrate of a first conductivity type;
    defining the semiconductor substrate with chip formation areas and scribe lane areas which define and isolate each chip formation area;
    forming a mask on the semiconductor substrate to open all chip formation areas except the scribe lane areas;
    forming a deep well area in each chip formation area by implanting an impurity of a second conductivity type using the mask and forming the scribe lane areas, each deep well area having a second conductivity type opposite the first conductivity type and the scribe lane areas having the first conductivity type;
    removing the mask; and
    forming at least one well area within the deep well area.

2. The method of claim 1, wherein the mask is formed on the semiconductor substrate such that the deep well areas are formed in the chip formation areas and not in the scribe lanes.

3. The method of claim 1, wherein, the first conductivity type is a p-type conductor; and the second conductivity type is a n-type conductor.

4. The method of claim 1, wherein the scribe lanes are formed at all portions surrounding the chip formation areas.

5. The method of claim 1, wherein the mask is removed using plasma processing or plasma equipment.

6. The method of claim 1, wherein each chip formation area is separated from each other by the scribe lane areas and is surrounded by the scribe lane areas.

7. The method of claim 1, wherein the deep well area is formed in all areas of each chip formation area.

8. The method of claim 1, wherein the first conductivity type is an n-type conductivity type and the second conductivity type is a p-type conductivity type.

9. A method for manufacturing a semiconductor device comprising:

preparing a semiconductor substrate of a first conductivity type;

forming scribe lanes of the first conductivity type in the semiconductor substrate, said scribe lanes isolation chip formation areas and containing only an unetched portion of the semiconductor surface;

forming a deep well area in all areas of each chip formation area except the scribe lanes, each deep well area having a second conductivity type opposite the first conductivity type; and forming separately a first conductive well area and a second conductive well area within the deep well area, wherein the first conductive well area is formed of the first conductivity type, and the second conductive well area is formed of the second conductivity type.

* * * * *